(12) United States Patent
Huang et al.

(10) Patent No.: US 8,357,861 B2
(45) Date of Patent: Jan. 22, 2013

(54) CIRCUIT BOARD, AND CHIP PACKAGE STRUCTURE

(75) Inventors: Shih-Fu Huang, Hsinchu County (TW); Yuan-Chang Su, Taoyuan County (TW); Chia-Hsiung Hsieh, Tainan County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 328 days.

(21) Appl. No.: 12/694,539

(22) Filed: Jan. 27, 2010

(65) Prior Publication Data

US 2011/0056736 A1 Mar. 10, 2011

(30) Foreign Application Priority Data

Sep. 9, 2009 (TW) .............................. 98130410 A

(51) Int. Cl.
*H05K 1/11* (2006.01)
(52) U.S. Cl. ........................ 174/262; 174/260
(58) Field of Classification Search .................. None
See application file for complete search history.

(56) References Cited

U.S. PATENT DOCUMENTS

| | | | | |
|---|---|---|---|---|
| 4,543,715 A * | 10/1985 | Iadarola et al. | ................. | 29/852 |
| 6,388,208 B1 * | 5/2002 | Kiani et al. | ................. | 174/266 |
| 7,408,261 B2 * | 8/2008 | Yoon et al. | ................. | 257/737 |
| 7,795,742 B2 * | 9/2010 | Bauer et al. | ................. | 257/778 |
| 7,830,018 B2 * | 11/2010 | Lee | ................. | 257/774 |
| 2002/0066949 A1 * | 6/2002 | Ahn et al. | ................. | 257/684 |
| 2008/0289864 A1 * | 11/2008 | En et al. | ................. | 174/257 |

FOREIGN PATENT DOCUMENTS

TW 200922413 5/2009

OTHER PUBLICATIONS

"Office Action of Taiwan counterpart application" issued on Jul. 20, 2012, p1-p9, in which the listed reference was cited.

* cited by examiner

*Primary Examiner* — Ishwarbhai Patel
(74) *Attorney, Agent, or Firm* — J.C. Patents

(57) ABSTRACT

A circuit board, a chip package structure and a fabrication method of the circuit board are provided. By applying the fabrication method, a plurality of conductive channels can be formed in a single through hole of the circuit substrate. Unlike the conductive channels respectively formed in the through holes according to the related art, the conductive channels of the proposed circuit board can be formed in a single through hole. As such, it is conducive to the expansion of available layout area of the circuit board, the increase in layout flexibility, and the improvement of layout density of the circuit board.

14 Claims, 13 Drawing Sheets

CIRCUIT BOARD, AND CHIP PACKAGE STRUCTURE

CROSS-REFERENCE TO RELATED APPLICATION

This application claims the priority benefit of Taiwan application serial no. 98130410, filed on Sep. 9, 2009. The entirety of the above-mentioned patent application is hereby incorporated by reference herein and made a part of this specification.

BACKGROUND OF THE INVENTION

1. Field of the Invention

The invention relates to a circuit board and a fabrication method thereof. More particularly, the invention relates a circuit board having high circuit density and a fabrication method thereof.

2. Description of Related Art

A conductive channel is an indispensable component of a circuit board when the circuit board technology is applied. The conductive channel can penetrate one or more insulating layers of the circuit board for connecting two adjacent circuit layers or two separated circuit layers of the circuit board. Therefore, the two circuit layers are electrically connected to each other.

FIG. 1A is a partial top view illustrating a conventional two-layered circuit board. FIG. 1B is a cross-sectional view taken along a line segment I-I of the circuit board as depicted in FIG. 1A. Please refer to both FIGS. 1A and 1B. The conventional two-layered circuit board 100 includes an insulating layer 110, two circuit layers 120 and 130, and two conductive channels 140 and 150. The circuit layers 120 and 130 are respectively disposed on an upper surface 112 and a lower surface 114 of the insulating layer 110. The circuit layer 120 has a first conductive trace 122 and a second conductive trace 124, and the circuit layer 130 has a third circuit 132 and a fourth circuit 134. The insulating layer 110 has two through holes 116 and 118 in which the conductive channels 140 and 150 are respectively disposed. The conductive channel 140 is connected between the first conductive trace 122 and the third circuit 132, and the conductive channel 150 is connected between the second conductive trace 124 and the fourth circuit 134.

According to the related art, a plurality of conductive channels and a plurality of through holes accommodating the conductive channels are required to electrically connect conductive traces located in two different circuit layers. Nonetheless, the through holes 116 and 118 bring about the decrease in available layout area of the circuit board 100 and the reduction of layout flexibility of the circuit board 100. Moreover, layout density of the circuit board 100 is unlikely to be improved.

SUMMARY OF THE INVENTION

The invention is directed to a fabrication method of a circuit board. By applying the fabrication method, a plurality of conductive channels can be formed in a single through hole.

The invention is further directed to a circuit board having a plurality of conductive channels located in a single through hole.

The invention is further directed to a chip package structure provided with a circuit board for carrying a chip, wherein the circuit board has a plurality of conductive channels located in a single through hole.

In the present application, a fabrication method of a circuit board is provided below. Firstly, a substrate having a through hole is provided. The substrate comprises an insulating layer, a first metal layer and a second metal layer. The insulating layer has a first surface and a second surface opposite thereto. The first metal layer and the second metal layer are respectively disposed on the first surface and the second surface. The through hole penetrates the insulating layer, the first metal layer and the second metal layer. A first conductive layer is then formed on the first metal layer, the second metal layer, and an inner wall of the through hole. Thereafter, a patterned second conductive layer is formed on the first conductive layer. Then, the first conductive layer, the first metal layer and the second metal layer are patterned to form a patterned first conductive layer, a patterned first metal layer and a patterned second metal layer, wherein the patterned first conductive layer, the patterned second conductive layer, the patterned first metal layer and the patterned second metal layer form a plurality of first conductive traces, a plurality of second conductive traces and a plurality of conductive channels. The conductive channels are located on the inner wall of the through hole and are electrically isolated from one another. The first conductive traces are located on the first surface, the second conductive traces are located on the second surface, and each conductive channel is connected between the corresponding first conductive trace and the corresponding second circuit. Then, a first solder mask layer is formed to cover at least a portion of the first conductive traces. There after, a second solder mask layer is formed to cover at least a portion of the second conductive traces.

In the invention, a circuit board including a substrate, a patterned first conductive layer, a patterned second conductive layer, a first solder mask layer and a second solder mask layer is provided. The substrate has a through hole. The substrate comprises an insulating layer, a patterned first metal layer and a patterned second metal layer. The insulating layer has a first surface and a second surface opposite thereto. The patterned first metal layer and the patterned second metal layer are respectively disposed on the first surface and the second surface. The through hole penetrates the insulating layer, the patterned first metal layer and the patterned second metal layer. The patterned first conductive layer is disposed on the patterned first metal layer, the patterned second metal layer, and an inner wall of the through hole. The patterned second conductive layer is disposed on the patterned first conductive layer. The patterned first metal layer, the patterned second metal layer, the patterned first conductive layer and the patterned second conductive layer forms a plurality of first conductive traces, a plurality of second conductive traces and a plurality of conductive channels. The conductive channels are located on the inner wall of the through hole and are electrically isolated from one another. The first conductive traces are located on the first surface, the second conductive traces are located on the second surface, and each conductive channel is connected between the corresponding first conductive trace and the corresponding second circuit. The first solder mask layer covers at least a portion of the first conductive traces. The second solder mask layer covers at least a portion of the second conductive traces.

In the invention, a chip package structure including a circuit board and a chip is provided. The circuit board includes a substrate, a patterned first conductive layer, a patterned second conductive layer, a first solder mask layer and a second solder mask layer. The substrate has a through hole. The substrate comprises an insulating layer, a patterned first metal layer and a patterned second metal layer. The insulating layer has a first surface and a second surface opposite thereto. The patterned first metal layer and the patterned second metal layer are respectively disposed on the first surface and the second surface. The through hole penetrates the insulating layer, the patterned first metal layer and the patterned second metal layer. The patterned first conductive layer is disposed on the patterned first metal layer, the patterned second metal layer, and an inner wall of the through hole. The patterned second conductive layer is disposed on the patterned first conductive layer. The patterned first metal layer, the patterned second metal layer, the patterned first conductive layer and the patterned second conductive layer forms a plurality of first conductive traces, a plurality of second conductive traces and a plurality of conductive channels. The conductive channels are located on the inner wall of the through hole and are electrically isolated from one another. The first conductive traces are located on the first surface, the second conductive traces are located on the second surface, and each conductive channel is connected between the corresponding first conductive trace and the corresponding second circuit. The first solder mask layer covers at least a portion of the first conductive traces. The second solder mask layer covers at least a portion of the second conductive traces. The chip is disposed on the circuit board and electrically connected to the circuit board.

Based on the above, unlike the conductive channels respectively formed in the through holes according to the related art, the conductive channels of the invention can be formed in a single through hole. As such, the invention is conducive to the expansion of available layout area of the circuit board, the increase in layout flexibility, and the improvement of layout density of the circuit board.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

Figure 1A:
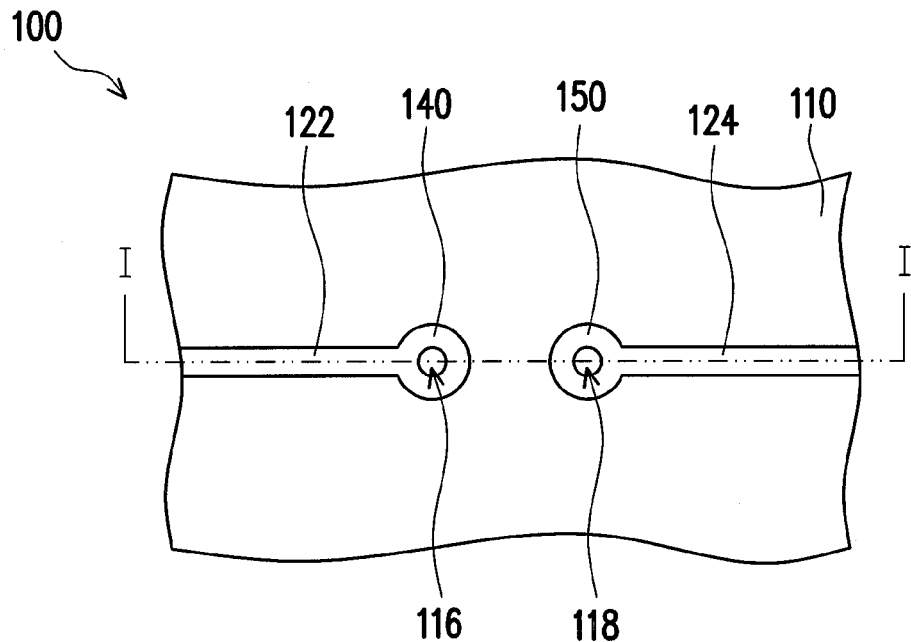
FIG. 1A is a partial top view illustrating a conventional two-layered circuit board.
Figure 1B:
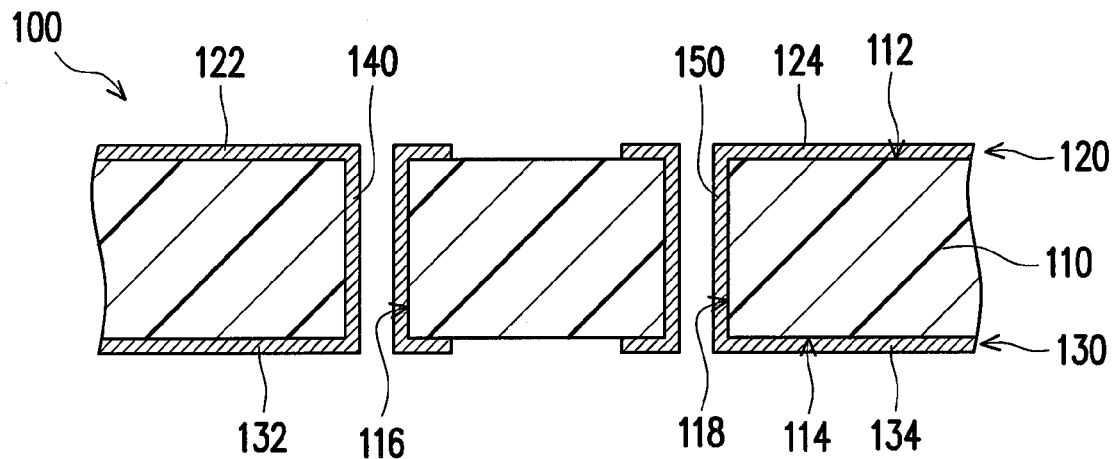
FIG. 1B is a cross-sectional view taken along a line segment I-I of the circuit board as depicted in FIG. 1A.
Figure 2A:
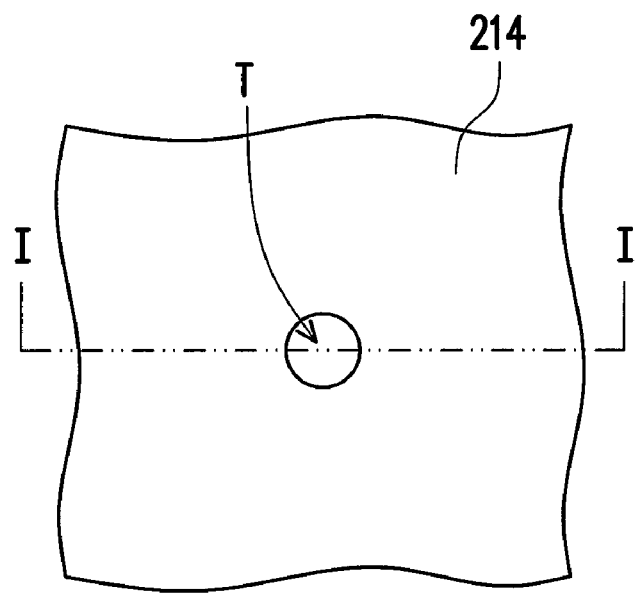
FIGS. 2A~2G are top views illustrating a fabrication process of a circuit board according to an embodiment of the invention.
Figure 2B:
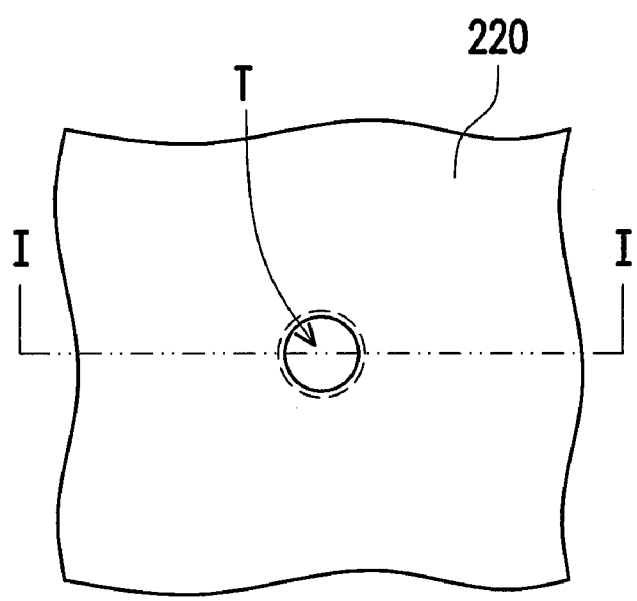
Figure 2C:
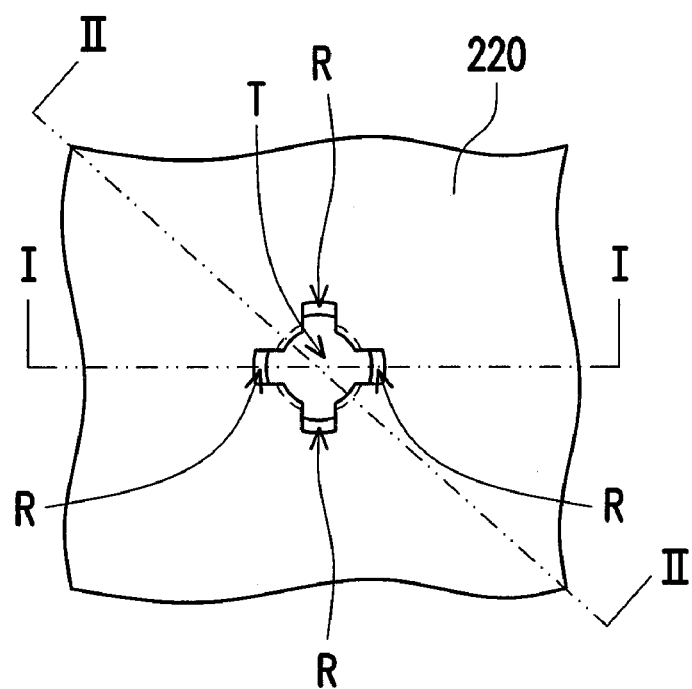
Figure 2D:
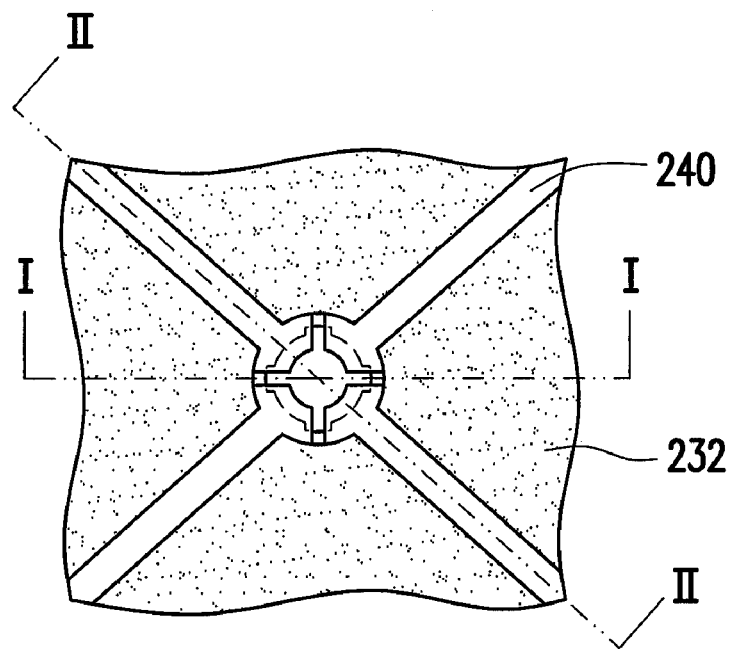
Figure 2E:
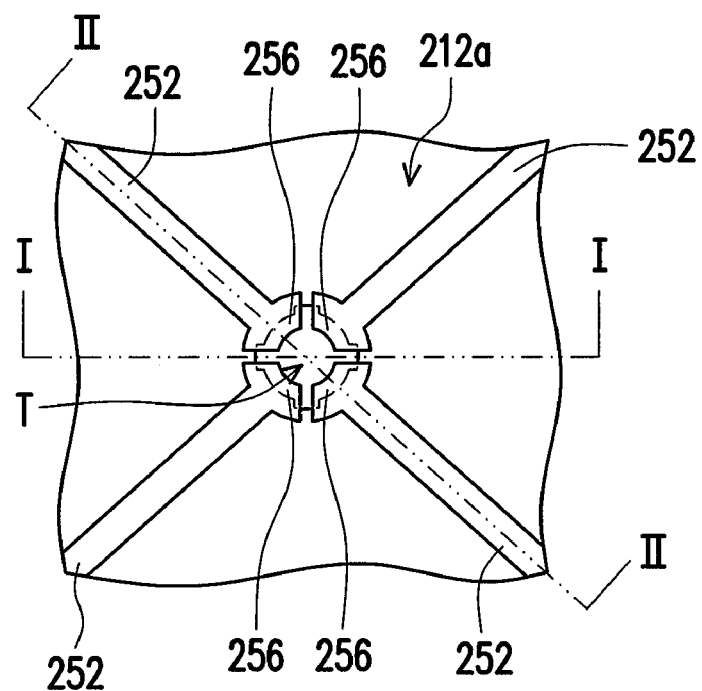
Figure 2F:
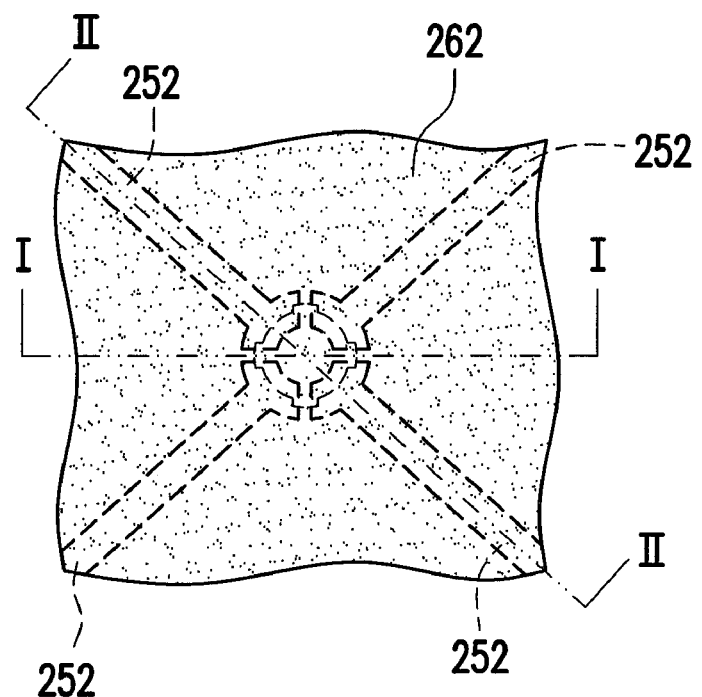
Figure 2G:
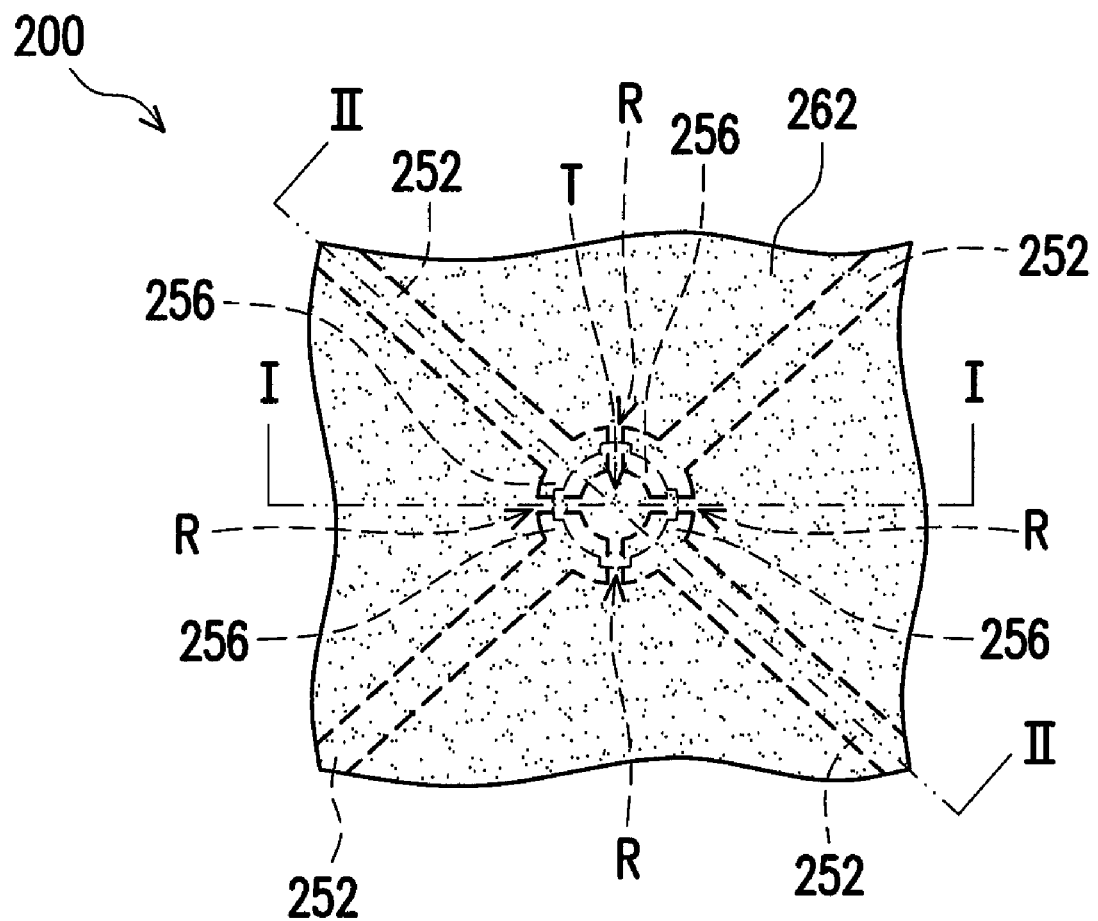

FIGS. 2A~2G are top views illustrating a fabrication process of a circuit board according to an embodiment of the invention. FIGS. 3A~3G are cross-sectional views taken along a line segment I-I depicted in FIGS. 2A~2G. FIGS. 4A~4E are cross-sectional views taken along a line segment II-II depicted in FIGS. 2C~2G. FIGS. 5A~5D are bottom views illustrating the fabrication process depicted in FIGS. 2D~2G. Note that FIG. 2F is a top view merely illustrating an area A depicted in FIG. 4D, while FIG. 2G is a top view merely illustrating an area A depicted in FIG. 4E.

Figure 3A:
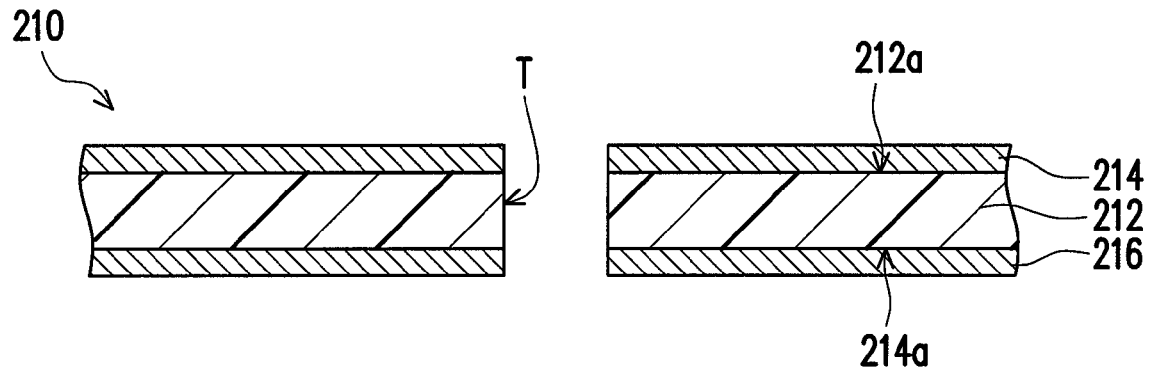
FIGS. 3A~3G are cross-sectional views taken along a line segment I-I depicted in FIGS. 2A~2G.

Referring to FIG. 2A and FIG. 3A, first, a substrate 210 is provided and the substrate 210 is, for example, a copper foil substrate. The substrate 210 has a through hole T. Specifically, the substrate 210 includes an insulating layer 212, a first metal layer 214 and a second metal layer 216, wherein the insulating layer 212 has a first surface 212a and a second surface 212b opposite thereto. The first metal layer 214 and the second metal layer 216 are respectively disposed on the first surface 212a and the second surface 212b. The first metal layer 214 and the second metal layer 216 can be respectively two copper foil layers in a thickness of 3 micrometer. The through hole T penetrates the insulating layer 212, the first metal layer 214 and the second metal layer 216, wherein the through hole T is formed by, for example, mechanical drilling.

Figure 3B:
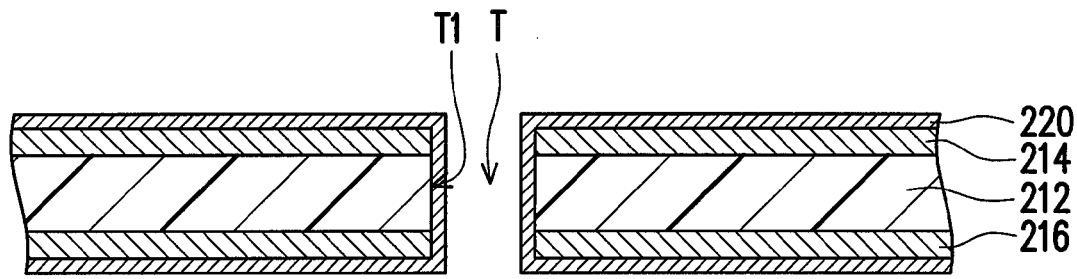

As shown in FIGS. 2B and 3B, a first conductive layer 220 is formed on the first metal layer 214, the second metal layer 216 and an inner wall T1 of the through hole T. According to the embodiment, a method of forming the first conductive layer 220 includes electroplating.

Figure 3C:
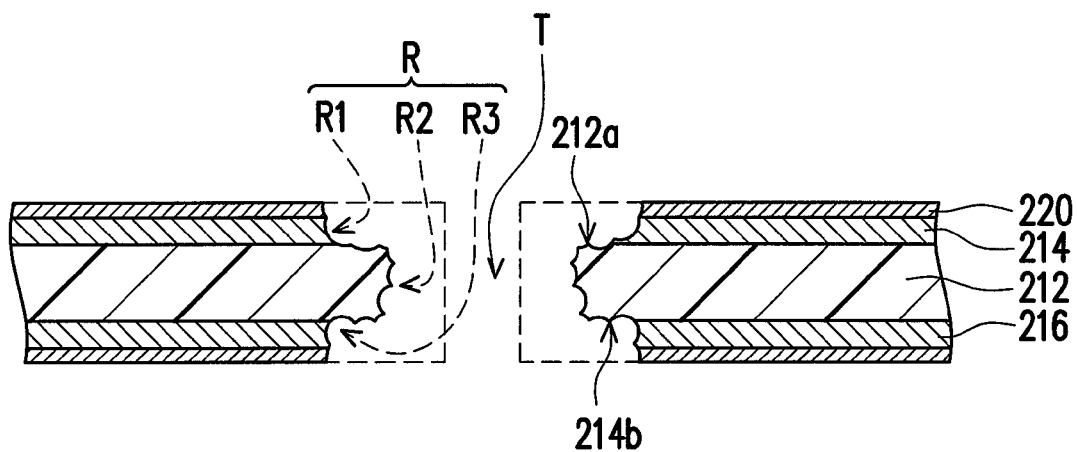
Figure 3D:
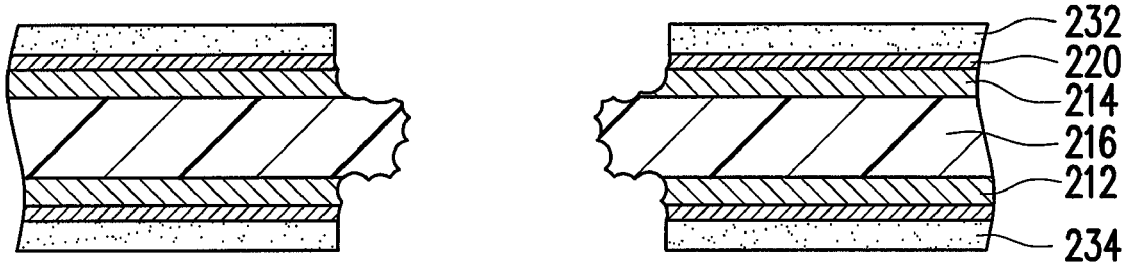
Figure 3E:
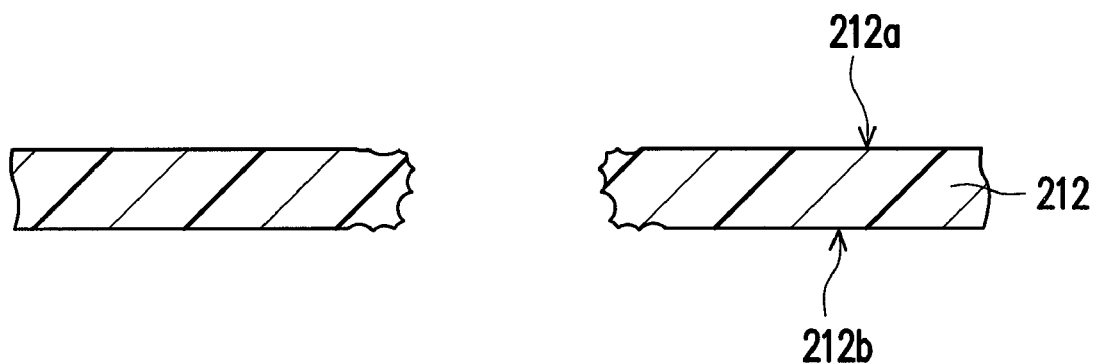
Figure 3F:
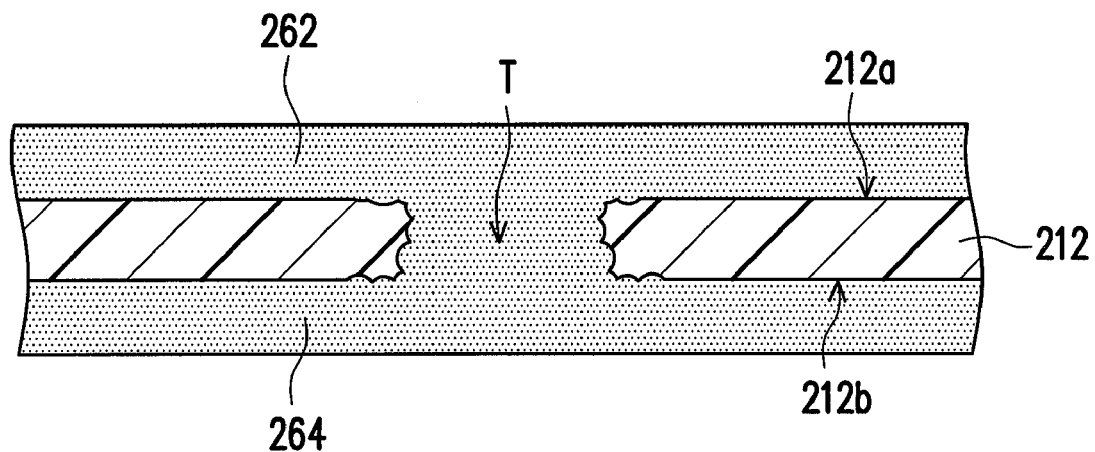
Figure 3G:
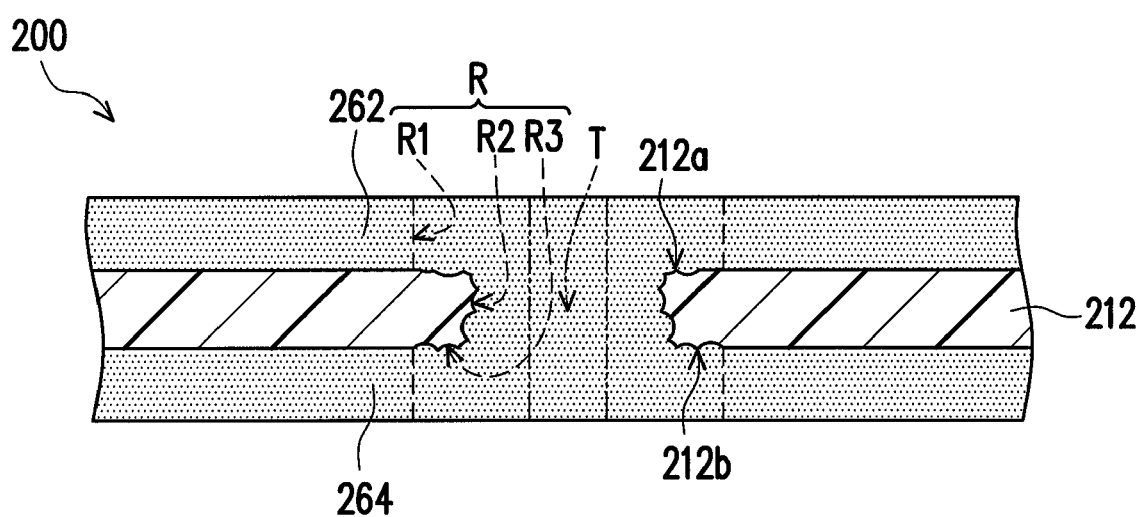
Figure 4A:
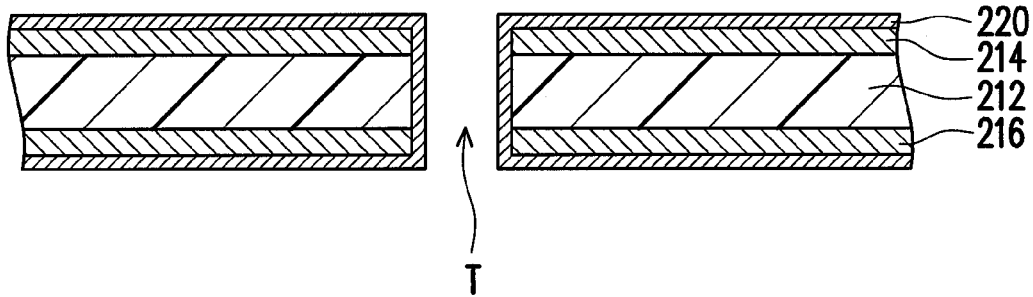
FIGS. 4A~4E are cross-sectional views taken along a line segment II-II depicted in FIGS. 2C~2G.
Figure 4B:
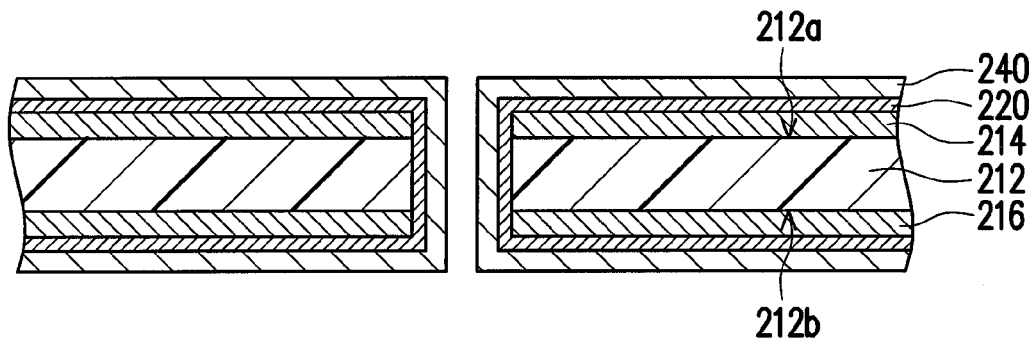
Figure 4C:
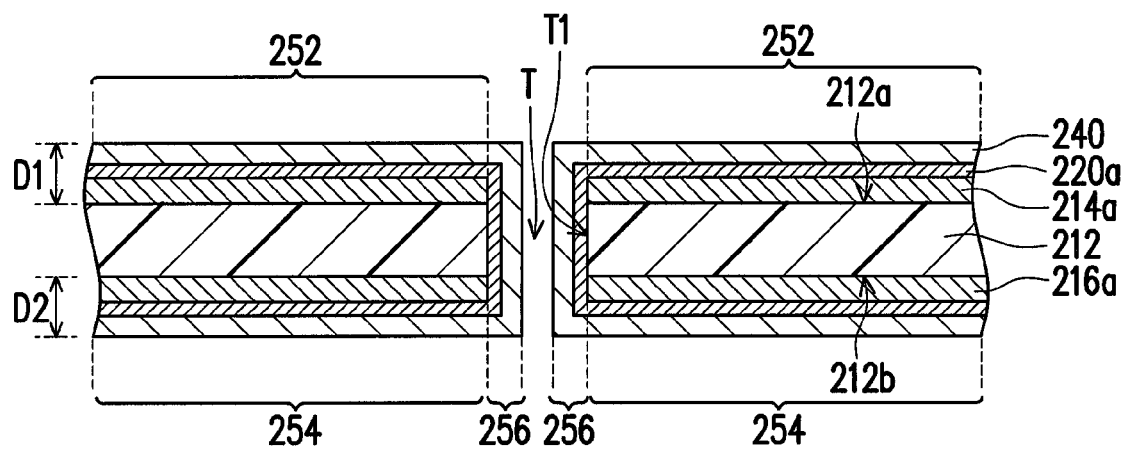
Figure 4D:
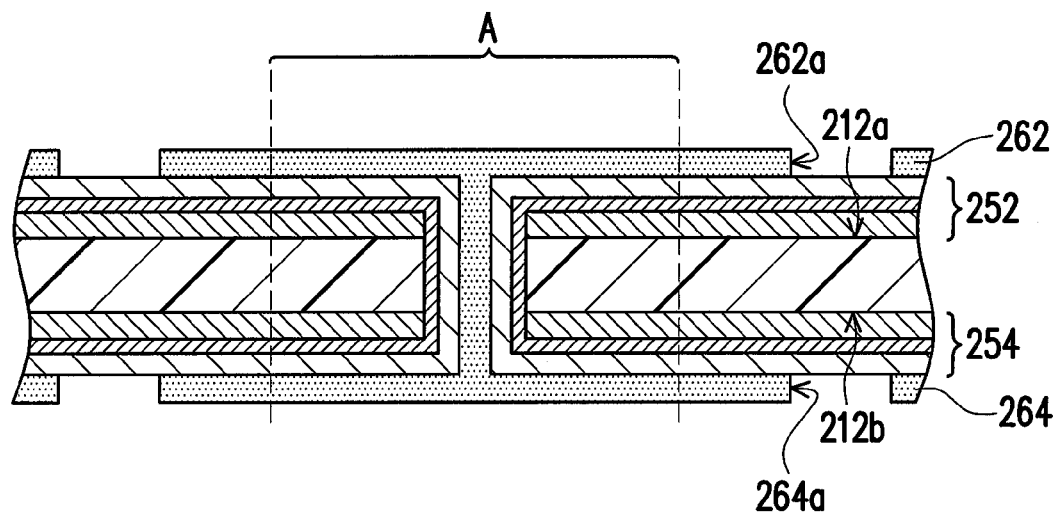
Figure 4E:
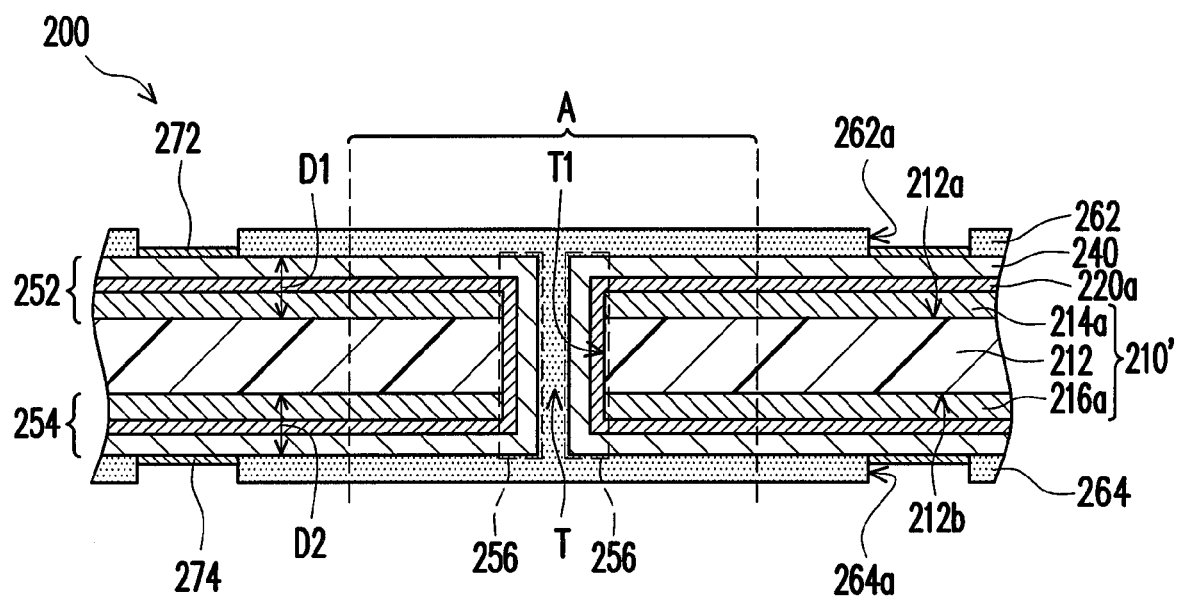
Figure 5A:
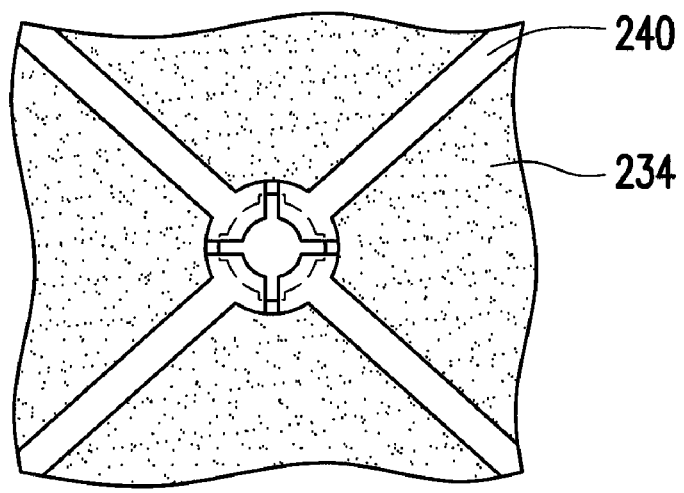
FIGS. 5A~5D are bottom views illustrating the fabrication process depicted in FIGS. 2D~2G.
Figure 5B:
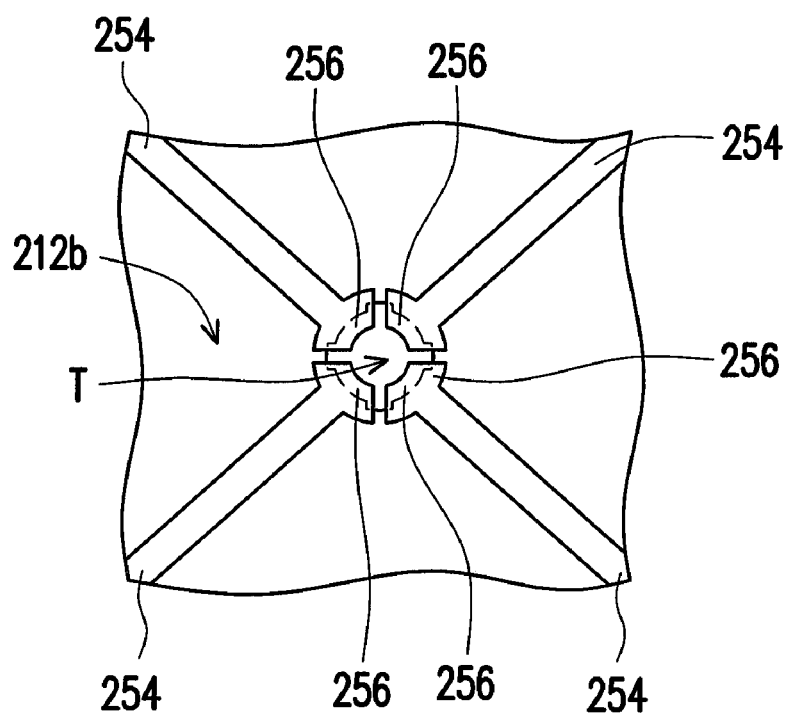
Figure 5C:
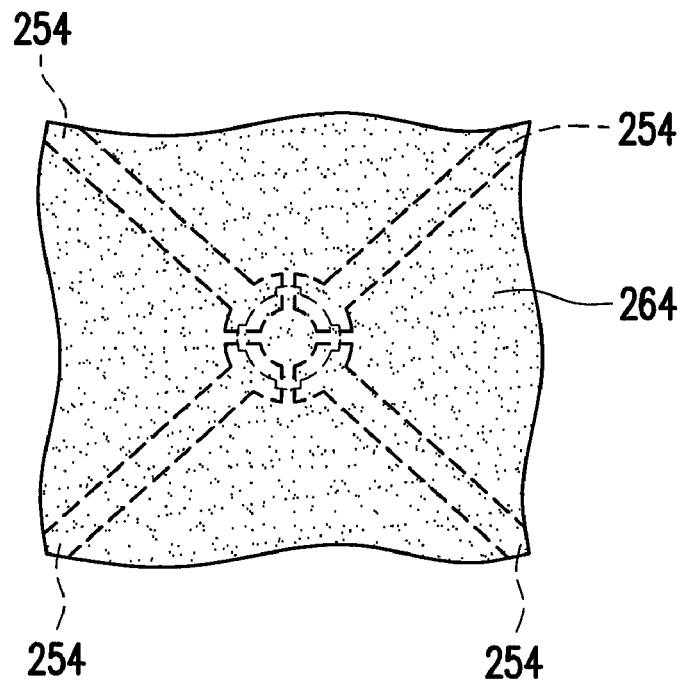
Figure 5D:
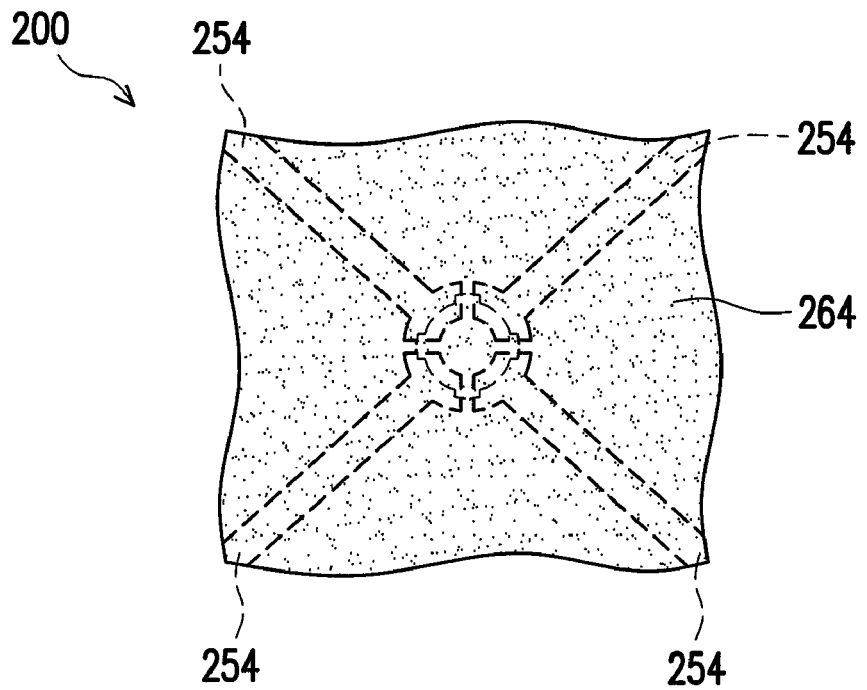

Referring to FIGS. 2C, 3C and 4A, trenches R are formed on the first conductive layer 220 by, for example, laser ablation. The trenches R extend from the first surface 212a to the second surface 212b via the through hole T and separate a part of the first conductive layer 220 located in the through hole T into a plurality of sub-portions. The trenches R partially expose the first surface 212a and the second surface 212b of the insulating layer 212 and the inner wall T1 of the through hole T. In this embodiment, each trench R has a first sub-trench R1, a second sub-trench R2 and a third sub-trench R3. The first sub-trench R1 penetrates the portion of the first conductive layer 220 located on the first surface 212a and the first metal layer 214. The second sub-trench R2 penetrates the portion of the first conductive layer 220 located in the through hole T. The third sub-trench R3 penetrates the portion of the first conductive layer 220 located on the second surface 212b and the second metal layer 216.

As shown in FIGS. 2D, 3D, 4B and 5A, a first patterned mask layer 232 and a second patterned mask layer 234 are respectively formed on other parts of the first conductive layer 220 located on the first metal layer 214 and the second metal layer 216. Then, a conductive material is electroplated on a part of the first conductive layer 220 exposed by the first patterned mask layer 232 and the second patterned mask layer 234 to form the patterned second conductive layer 240.

As shown in FIGS. 2E, 3E, 4C and 5B, the first conductive layer 220, the first metal layer 214 and the second metal layer 216 are patterned to form a patterned first conductive layer 220a, a patterned first metal layer 214a and a patterned second metal layer 216a. The patterned first metal layer 214a, the patterned second metal layer 216a, the patterned first conductive layer 220a and the patterned second conductive layer 240 forms a plurality of first conductive traces 252, a plurality of second conductive traces 254 and a plurality of conductive channels 256. The conductive channels 256 are located on the inner wall T1 of the through hole T and are electrically isolated from one another. The first conductive traces 252 are located on the first surface 212a, the second conductive traces 254 are located on the second surface 212b, and each conductive channel 256 is connected between the corresponding first conductive trace 252 and the corresponding second conductive trace 254. In the present embodiment, the thickness D1 of the first conductive traces 252 and the thickness D2 of the second conductive traces 254 are larger than 10 micrometer.

In this embodiment, the step of patterning the first conductive layer 220, the first metal layer 214 and the second metal layer 216 comprises etching the first conductive layer 220, the first metal layer 214 and the second metal layer 216 by using the patterned second conductive layer 240 as a mask. In other embodiments, the patterned second conductive layer 240 can be entirely removed in the step of patterning the first conductive layer 220, the first metal layer 214 and the second metal layer 216.

As shown in FIGS. 2F, 3F, 4D and 5C, a first solder mask layer 262 covering a part of the first conductive traces 252 and a second solder mask layer 264 covering a part of the second conductive traces 254 are formed. The first solder mask layer 262 has a plurality of first openings 262a for exposing a part of the first conductive traces 252, and the second solder mask layer 264 has a plurality of second openings 264a for exposing a part of the second conductive traces 254.

As shown in FIGS. 2G, 3G, 4E and 5D, a first surface finish layer 272 (e.g. nickel-gold layer) is formed on a part of the first conductive trace 252 exposed by the first solder mask layer 262 and a second surface finish layer 274 (e.g. Ni/Au layer) is formed on a part of the second conductive trace 254 exposed by the second solder mask layer 264, so as to prevent the exposed parts of the first conductive trace 252 and the second conductive trace 254 from being oxidized or contaminated by the outside surroundings. The first surface finish layer 272 is formed in the first openings 262a, and the second surface finish layer 274 is formed in the second openings 264a. So far, the circuit board 200 of the present embodiment is initially formed.

The structure of the circuit board in this embodiment is elaborated hereinafter.

As shown in FIGS. 2G, 3G, 4E and 5D, the circuit board 200 of the present embodiment includes a substrate 210', a patterned first conductive layer 220a, a patterned second conductive layer 240, a first solder mask layer 262 and a second solder mask layer 264.

The substrate 210' (e.g. copper foil substrate) has a through hole T and the substrate 210' comprises an insulating layer 212, a patterned first metal layer 214a and a patterned second metal layer 216a. In this embodiment, the patterned first metal layer 214a and the patterned second metal layer 216a are respectively copper foil layers in a thickness of 3 micrometer. The insulating layer 212 has a first surface 212a and a second surface 212b opposite thereto. The patterned first metal layer 214a and the patterned second metal layer 216a are respectively disposed on the first surface 212a and the second surface 212b. The through hole T penetrates the insulating layer 212, the patterned first metal layer 214a and the patterned second metal layer 216a.

The patterned first conductive layer 220a is disposed on the patterned first metal layer 214a, the patterned second metal layer 216a, and an inner wall T1 of the through hole T. The patterned second conductive layer 240 is disposed on the patterned first conductive layer 220a. The patterned first metal layer 214a, the patterned second metal layer 216a, the patterned first conductive layer 220a and the patterned second conductive layer 240 form a plurality of first conductive traces 252, a plurality of second conductive traces 254 and a plurality of conductive channels 256.

The conductive channels 256 are located on an inner wall T1 of the through hole T and are isolated from one another. The first conductive traces 252 are located on the first surface 212a, the second conductive traces 254 are located on the second surface 212b, and each conductive channel 256 is connected between the corresponding first conductive trace 252 and the corresponding second conductive trace 254. The thickness D1 of the first conductive traces 252 and the thickness D2 of the second conductive traces 254 are larger than 10 micrometer.

Furthermore, in this embodiment, the circuit board 200 has a plurality of trenches R extending from the first surface 212a to the second surface 212b via the through hole T, and the trenches R divide a part of the first conductive layer 220a located in the through hole T into a plurality of sub-portions. Each trench R has a first sub-trench R1, a second sub-trench R2 and a third sub-trench R3. The first sub-trench R1 penetrates the portion of the patterned first conductive layer 220a located on the first surface 212a and the patterned first metal layer 214a. The second sub-trench R2 penetrates the portion of the patterned first conductive layer 220a located in the through hole T. The first sub-trench R3 penetrates the portion of the patterned first conductive layer 220a located on the second surface 212b and the patterned second metal layer 216a. In this embodiment, the trenches R are laser fabricated trenches and the trenches R partially expose the first surface 212a and the second surface 212b of the insulating layer 212 and the inner wall T1 of the through hole T.

The first solder mask layer 262 covers at least a portion of the first conductive traces 252. The second solder mask layer 264 covers at least a portion of the second conductive traces 254. The first solder mask layer 262 has a plurality of first openings 262a for exposing a part of the first conductive traces 252, and the second solder mask layer 264 has a plurality of second openings 264a for exposing a part of the second conductive traces 254.

In addition, a first surface finish layer 272 (e.g. Ni/Au layer) is formed on a part of the first conductive trace 252 exposed by the first solder mask layer 262 and a second surface finish layer 274 (e.g. Ni/Au layer) is formed on a part of the second conductive trace 254 exposed by the second solder mask layer 264, so as to prevent the exposed parts of the first conductive trace 252 and the second conductive trace 254 from being oxidized or contaminated by the outside surroundings. The first surface finish layer 272 is formed in the first openings 262a, and the second surface finish layer 274 is formed in the second openings 264a. Material of the first surface finish layer 272 and the second surface finish layer 274 includes nickel-gold, tin, tin-silver alloy, or organic solderability preservative (OSP).

It should be noted that as the circuit board 200 has a high layout density, the circuit board 200 can be used as a chip carrying substrate of chip package in high contact density.

The chip package structure applying the circuit board in this embodiment is elaborated hereinafter.

Figure 6:
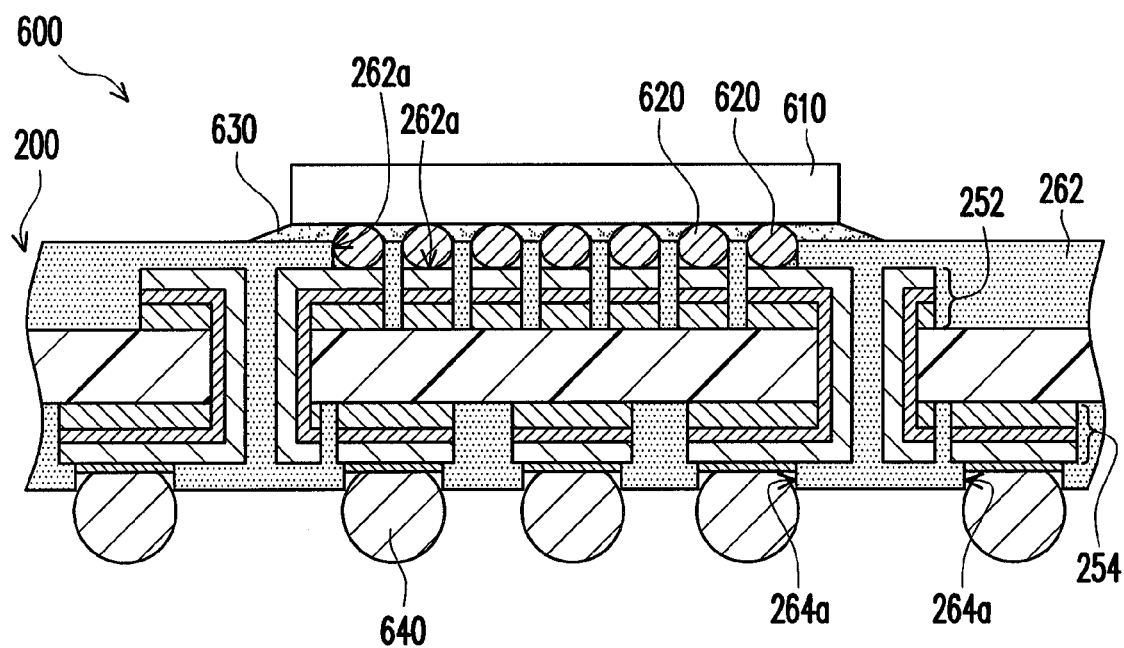
FIG. 6 is a cross-sectional view of a chip package structure according to an embodiment of the present application.

FIG. 6 is a cross-sectional view of a chip package structure according to an embodiment of the present application. Referring to FIG. 6, a chip package structure 600 of the present embodiment includes a circuit board 200 and a chip 610, wherein illustrations of the circuit board 200 can be referred to FIG. 4E and are not repeated herein. The chip 610 is disposed on the circuit board 200 and electrically connected to the circuit board 200.

In this embodiment, a plurality of conductive bumps 620 are disposed between the chip 610 and the circuit board 200 for electrically connecting the chip 610 and the circuit board 200. The conductive bumps 620 are connected to the first conductive traces 252 via the first openings 262a of the first solder mask layer 262. Moreover, in the present embodiment, an underfill 630 is disposed between the chip 610 and the circuit board 200 for covering the conductive bumps 620. In another embodiment, the chip 610 can be electrically connected to the circuit board 200 via a plurality of wires (not shown), and a molding compound (not shown) is formed on the circuit board 200 to encapsulate the wires. Furthermore, a plurality of solder balls 640 are formed on the part of the second conductive traces 254 exposed by the second openings 264a and electrically connected to other electronic components.

In light of the foregoing, unlike the conductive channels respectively formed in the through holes according to the related art, the conductive channels of the invention can be formed in a single through hole. As such, the invention is conducive to the expansion of available layout area of the circuit board, the increase in layout flexibility, and the improvement of layout density of the circuit board.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A circuit board, comprising:
  a substrate, having a through hole, wherein the substrate comprises an insulating layer, a patterned first metal layer and a patterned second metal layer, the insulating layer has a first surface and a second surface opposite thereto, the patterned first metal layer and the patterned second metal layer are respectively disposed on the first surface and the second surface, and the through hole penetrates the insulating layer, the patterned first metal layer and the patterned second metal layer;
  a patterned first conductive layer, disposed on the patterned first metal layer, the patterned second metal layer and an inner wall of the through hole;
  a patterned second conductive layer, disposed on the patterned first conductive layer, wherein the patterned first metal layer, the patterned second metal layer, the patterned first conductive layer and the patterned second conductive layer form a plurality of first conductive traces, a plurality of second conductive traces and a plurality of conductive channels, the conductive channels are located on the inner wall of the through hole and are electrically isolated from one another, the first conductive traces are located on the first surface, the second conductive traces are located on the second surface, and each conductive channel is connected between the corresponding first conductive trace and the corresponding second conductive trace, wherein the insulating layer has a plurality of trenches therein and every two of the conductive channels is separated by one corresponding trench, and each trench extends only from the first surface of the insulating layer to the second surface of the insulating layer;
  a first solder mask layer, covering at least a portion of the first conductive traces; and
  a second solder mask layer, covering at least a portion of the second conductive traces.

2. The circuit board as claimed in claim 1, wherein the first conductive trace and the second conductive trace respectively has a thickness larger than 10 micrometer.

3. A chip package structure, comprising:
  a circuit board, comprising:
    a substrate, having a through hole, wherein the substrate comprises an insulating layer, a patterned first metal layer and a patterned second metal layer, the insulating layer has a first surface and a second surface opposite thereto, the patterned first metal layer and the patterned second metal layer are respectively disposed on the first surface and the second surface, and the through hole penetrates the insulating layer, the patterned first metal layer and the patterned second metal layer;
    a patterned first conductive layer, disposed on the patterned first metal layer, the patterned second metal layer and an inner wall of the through hole;
    a patterned second conductive layer, disposed on the patterned first conductive layer, wherein the patterned first metal layer, the patterned second metal layer, the patterned first conductive layer and the patterned second conductive layer form a plurality of first conductive traces, a plurality of second conductive traces and a plurality of conductive channels, the conductive channels are located on the inner wall of the through hole and are electrically isolated from one another, the first conductive traces are located on the first surface, the second conductive traces are located on the second surface, and each conductive channel is connected between the corresponding first conductive trace and the corresponding second conductive trace, wherein the insulating layer has a plurality of trenches therein and every two of the conductive channels is separated by one corresponding trench, and each trench extends only from the first surface of the insulating layer to the second surface of the insulating layer;
    a first solder mask layer, covering at least a portion of the first conductive traces;
    a second solder mask layer, covering at least a portion of the second conductive traces; and
  a chip, disposed on the circuit board and electrically connected to the circuit board.

4. The chip package structure as claimed in claim 3, further comprising:
  a plurality of conductive bumps, disposed between the chip and the circuit board for electrically connecting the chip and the circuit board; and
  an underfill, disposed between the chip and the circuit board for covering the conductive bumps.

5. The chip package structure as claimed in claim 3, further comprising:
  a plurality of conductive wires, electrically connecting the chip and the circuit board; and
  a molding compound, disposed on the circuit board and encapsulating the conductive wires.

6. The chip package structure as claimed in claim 3, wherein the first conductive trace and the second conductive trace respectively has a thickness larger than 10 micrometer.

7. The chip package structure as claimed in claim 3, wherein the first solder mask layer has a plurality of first openings for exposing a part of the first conductive traces.

8. The chip package structure as claimed in claim 3, wherein the second solder mask layer has a plurality of second openings for exposing a part of the second conductive traces.

9. A chip package structure, comprising:
  a circuit board, comprising:
    a substrate, having a through hole, wherein the substrate comprises an insulating layer, a patterned first metal layer and a patterned second metal layer, the insulating layer has a first surface and a second surface opposite thereto, the patterned first metal layer and the patterned second metal layer are respectively disposed on the first surface and the second surface, and the through hole penetrates the insulating layer, the patterned first metal layer and the patterned second metal layer;

a patterned first conductive layer, disposed on the patterned first metal layer, the patterned second metal layer and an inner wall of the through hole;

a patterned second conductive layer, disposed on the patterned first conductive layer, wherein the patterned first metal layer, the patterned second metal layer, the patterned first conductive layer and the patterned second conductive layer form a plurality of first conductive traces, a plurality of second conductive traces and a plurality of conductive channels, the conductive channels are located on the inner wall of the through hole and are electrically isolated from one another, the first conductive traces are located on the first surface, the second conductive traces are located on the second surface, and each conductive channel is connected between the corresponding first conductive trace and the corresponding second conductive trace, wherein the insulating layer has a plurality of trenches therein and every two of the conductive channels is separated by one corresponding trench, and each trench extends only from the first surface of the insulating layer to the second surface of the insulating layer;

a first solder mask layer, covering at least a portion of the first conductive traces;

a second solder mask layer, covering at least a portion of the second conductive traces;

a first surface finish layer, disposed on a portion of the first conductive traces exposed by the first solder mask layer;

a second surface finish layer, disposed on a portion of the second conductive traces exposed by the second solder mask layer; and a chip, disposed on the circuit board and electrically connected to the circuit board.

10. The chip package structure as claimed in claim 9, further comprising:

a plurality of conductive bumps, disposed between the chip and the circuit board for electrically connecting the chip and the circuit board; and an underfill, disposed between the chip and the circuit board for covering the conductive bumps.

11. The chip package structure as claimed in claim 9, further comprising:

a plurality of conductive wires, electrically connecting the chip and the circuit board; and a molding compound, disposed on the circuit board and encapsulating the conductive wires.

12. The chip package structure as claimed in claim 9, wherein the first conductive trace and the second conductive trace respectively has a thickness larger than 10 micrometer.

13. The chip package structure as claimed in claim 9, wherein the first solder mask layer has a plurality of first openings for exposing a part of the first conductive traces.

14. The chip package structure as claimed in claim 9, wherein the second solder mask layer has a plurality of second openings for exposing a part of the second conductive traces.

* * * * *